(12) United States Patent
Fujimasa et al.

(10) Patent No.: US 12,177,992 B2
(45) Date of Patent: Dec. 24, 2024

(54) ELECTRONIC CONTROL DEVICE WITH ELECTROMAGNETIC COMPATIBILITY FOR VEHICLE CONTROL

(71) Applicant: Hitachi Astemo, Ltd., Hitachinaka (JP)

(72) Inventors: Toshiyuki Fujimasa, Tokyo (JP); Eiji Ichikawa, Tokyo (JP); Masao Horie, Tokyo (JP); Masashi Saito, Tokyo (JP); Hiroi Nambu, Tokyo (JP); Tomokazu Tanase, Tokyo (JP)

(73) Assignee: Hitachi Astemo, Ltd., Ibaraki (JP)

( * ) Notice: Subject to any disclaimer, the term of this patent is extended or adjusted under 35 U.S.C. 154(b) by 212 days.

(21) Appl. No.: 17/639,502

(22) PCT Filed: Aug. 14, 2020

(86) PCT No.: PCT/JP2020/030846
§ 371 (c)(1),
(2) Date: Mar. 1, 2022

(87) PCT Pub. No.: WO2021/044831
PCT Pub. Date: Mar. 11, 2021

(65) Prior Publication Data
US 2022/0304169 A1     Sep. 22, 2022

(30) Foreign Application Priority Data

Sep. 2, 2019 (JP) ................. 2019-159846

(51) Int. Cl.
| | | |
|---|---|---|
| H05K 5/00 | (2006.01) |
| H05K 5/02 | (2006.01) |
| H05K 5/03 | (2006.01) |
| H05K 7/14 | (2006.01) |

(52) U.S. Cl.
CPC ......... *H05K 5/0069* (2013.01); *H05K 5/0217* (2013.01); *H05K 5/03* (2013.01); *H05K 7/1427* (2013.01)

(58) Field of Classification Search
CPC ...... H05K 5/0069; H05K 5/0217; H05K 5/03; H05K 7/1427; H05K 5/0039
See application file for complete search history.

(56) References Cited

U.S. PATENT DOCUMENTS

| | | | |
|---|---|---|---|
| 8,532,882 B2 * | 9/2013 | Akiyama | ............. H05K 5/0078 |
| | | | 701/1 |
| 2012/0010784 A1 | 1/2012 | Akiyama | |
| 2014/0263967 A1 | 9/2014 | Wober | |

FOREIGN PATENT DOCUMENTS

| | | | | |
|---|---|---|---|---|
| JP | 05-011498 U | 2/1993 | | |
| JP | 08-250885 A | 9/1996 | | |
| JP | 2006245143 A * | 9/2006 | ............... H05K 5/03 |

(Continued)

*Primary Examiner* — James Wu
*Assistant Examiner* — Dakota M Talbert
(74) *Attorney, Agent, or Firm* — Volpe Koenig

(57) ABSTRACT

To provide an electronic control device capable of securing electromagnetic compatibility and mechanical strength. An electronic control device includes a base portion formed in a bottomed cylindrical shape; an electronic control board provided in the base portion; and connectors provided on an opening side of the base portion and electrically connected to the electronic control board, in which the base portion includes a first layer formed of a conductive member and a second layer formed of a member different from that of the first layer.

16 Claims, 7 Drawing Sheets

(56) References Cited

FOREIGN PATENT DOCUMENTS

| | | | | |
|---|---|---|---|---|
| JP | 2013069781 A | * | 4/2013 | |
| JP | 2014-209625 A | | 11/2014 | |
| JP | 2016082007 A | * | 5/2016 | ............... H05K 9/00 |
| JP | 2016-201479 A | | 12/2016 | |
| WO | 2010/107025 A1 | | 9/2010 | |

* cited by examiner

ELECTRONIC CONTROL DEVICE WITH ELECTROMAGNETIC COMPATIBILITY FOR VEHICLE CONTROL

TECHNICAL FIELD

The present invention relates to an electronic control device.

BACKGROUND ART

In the related art, an electronic control device that controls a vehicle has been known. A plurality of electronic control devices are provided in the vehicle, and control actuators and the like. Each electronic control device is connected to a bus network (CAN: Controller Area Network), and mutually transmits and receives information.

In order to drive a vehicle safely, an electronic control device has been required to have electromagnetic compatibility (EMC). A technique for securing electromagnetic compatibility by adopting a conductive member for a housing of an electronic control device (PTL 1) has been known.

The technique of PTL 1 discloses a shield case capable of providing a shield to a connection portion by various general-purpose connectors. The shield case includes a metallic lower case attached to a housing of the electronic control device and a metallic upper case fitted into the lower case. The upper case and the lower case have a clamping portion that clamps a shield conductor of a harness connected to the connector. The shield conductor of the harness is clamped by the clamping portion. The shield conductor of the harness, the lower case, and the upper case are electrically connected by fastening the upper case and the lower case.

CITATION LIST

Patent Literature

PTL 1: JP 2014-209625 A

SUMMARY OF INVENTION

Technical Problem

In PTL, a metallic shield case is provided. However, the electronic control device has been required to have not only electromagnetic compatibility but also weight reduction and reduction in product cost and manufacturing cost. Since a metal case is heavier than a resin case and has high component cost, there is room for improvement in weight reduction and reduction in component cost.

On the other hand, since the resin case has insulating properties, electromagnetic shielding performance is lower than that of the metal case. In order to secure the electromagnetic compatibility, a noise countermeasure component or a noise removal filter may be provided on the electronic control board. However, the electronic control device has been required to be downsized, and accordingly, the area of an electromagnetic control board is also downsized. As a result, there may be a case where a space for providing a noise countermeasure component, a noise removal filter, or the like on the electronic control board cannot be secured.

A conductive resin formed by mixing a metal member with a resin has been known. By using the case made of the conductive resin, the electronic control device can reduce the weight and the product cost while maintaining the shielding performance. However, the conductive resin has mechanical strength lower than that of the insulating resin. Since vibration occurs in the vehicle, it may be difficult to dispose the electronic control device using the conductive resin in the vehicle.

Therefore, the present invention has been made to solve the above problems, and an object thereof is to provide an electronic control device capable of securing electromagnetic compatibility and mechanical strength.

Solution to Problem

An electronic control device including a base portion formed in a bottomed cylindrical shape; an electronic control board provided in the base portion; and a connector provided on an opening side of the base portion and electrically connected to the electronic control board, in which the base portion includes a first layer formed of a conductive member and a second layer formed of a member different from that of the first layer.

Advantageous Effects of Invention

According to the present invention, electromagnetic compatibility and mechanical strength can be secured.

DESCRIPTION OF EMBODIMENTS

Figure 1:
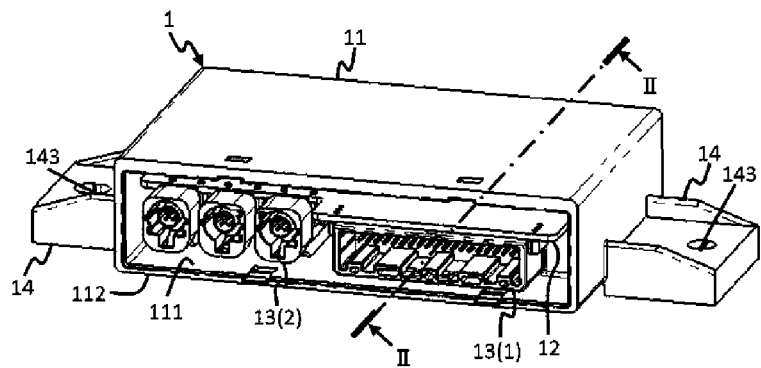
FIG. 1 is a perspective view of an electronic control device according to a first example.

The present embodiment relates to an electronic control device capable of securing electromagnetic compatibility and mechanical strength. Hereinafter, examples of the present embodiment will be described with reference to the drawings, but the present embodiment is not limited to the examples described in the drawings.

In the present examples, a width direction indicates a longitudinal direction of an electronic control device, a front direction indicates an opening direction of a base portion, a depth direction indicates a direction with respect to the front direction, a downward direction indicates a direction of the electronic component provided on an electronic control board, and an upward direction indicates a direction with respect to the downward direction.

First Example

FIG. 1 is a perspective view of an electronic control device 1. The electronic control device 1 is, for example, an electronic control unit (ECU) that controls a vehicle. The electronic control device 1 includes, for example, a base portion 11, an electronic control board 12, connectors 13(1) and 13(2), and an attachment portion 14.

The base portion 11 is formed in a bottomed cylindrical shape and protects the electronic control board 12. The base portion 11 is formed in, for example, a bottomed square tubular shape with an opening on the front side. The base portion 11 will be described in detail with reference to FIG. 1(2).

The electronic control board 12 is provided in the base portion 11 and includes at least one electronic component 121 that controls the vehicle. The electronic component 121 is, for example, a memory that stores a program, a central processing unit (CPU), or the like. The electronic control board 12 is provided by a fixing portion 122 on, for example, a side surface of the base portion 11 in the width direction and a back surface of the base portion 11 in the depth direction.

The connector 13(1) and the connector 13(2) are terminals having different shapes. The connector 13(1) and the connector 13(2) may be referred to as a connector 13 unless otherwise distinguished. The connector 13 is provided, for example, on the opening side of the base portion 11 and is electrically connected to the electronic control board 12.

The attachment portion 14 is attached to the vehicle as "another device" by, for example, a screw. The attachment portion 14 is formed so as to protrude outward from the side surface of the base portion 11, for example. A screw hole 143 penetrating in the vertical direction is formed in the attachment portion 14. The attachment portion 14 is formed of, for example, a resin.

The electronic control device 1 is screwed to the vehicle by, for example, the attachment portion 14. Note that the electronic control device 1 is not limited to being screwed, and may be attached to the vehicle by another attachment method such as welding or adhesion. In this case, the attachment portion 14 is not limited to the screw hole 143, and may have a configuration corresponding to another attachment method.

Figure 2:
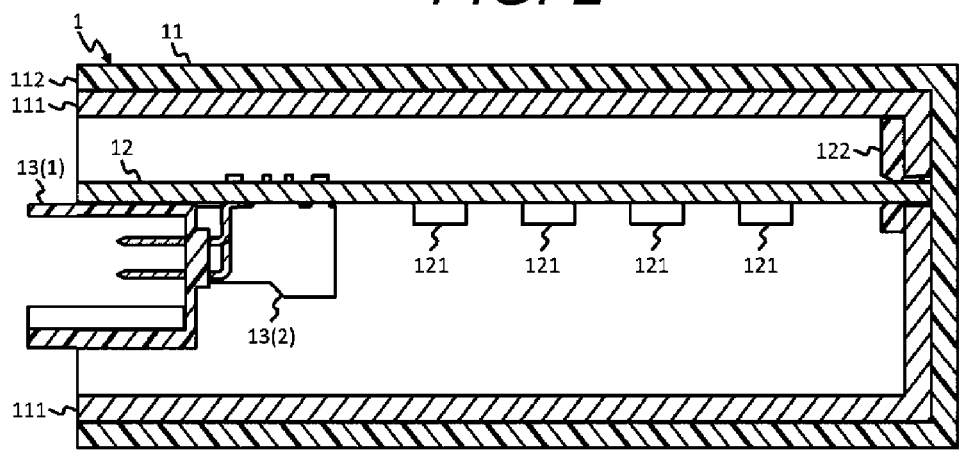
FIG. 2 is a schematic cross-sectional view taken along line II-II.

FIG. 2 is a schematic cross-sectional view taken along line II-II in FIG. 1. The base portion 11 is formed by stacking a shield layer 111 as a "first layer" and a reinforcing layer 112 as a "second layer". The base portion 11 is formed of, for example, two layers of a shield layer 111 and a reinforcing layer 112.

The shield layer 111 is formed of a conductive member. As a result, the shield layer 111 suppresses electromagnetic noise generated from the electronic component 121 and suppresses the electromagnetic noise from the outside. The shield layer 111 is formed of, for example, metal such as aluminum. Further, the shield layer 111 can be molded as one component by using a conductive resin and the reinforcing layer 112 by using a non-conductive resin. The shield layer 111 is provided inside the reinforcing layer 112.

The reinforcing layer 112 is formed of a member different from that of the shield layer 111, and reinforces the mechanical strength of the electronic control device 1. The reinforcing layer 112 is formed of, for example, a resin that is mechanically stronger than the shield layer 111. The reinforcing layer 112 is formed so as to cover, for example, a side surface, an upper surface, a lower surface, and a back surface of the shield layer 111.

Since the electronic control device 1 described above includes the reinforcing layer 112 in the base portion 11, it is possible to secure mechanical strength at low cost as compared with a base portion formed only of a conductive member. Since the electronic control device 1 includes the shield layer 111 in the base portion 11, the electromagnetic compatibility can be secured without providing a noise countermeasure component in the electronic control board 12. As a result, the electronic control device 1 can secure the electromagnetic compatibility and the mechanical strength.

Second Example

Figure 3:
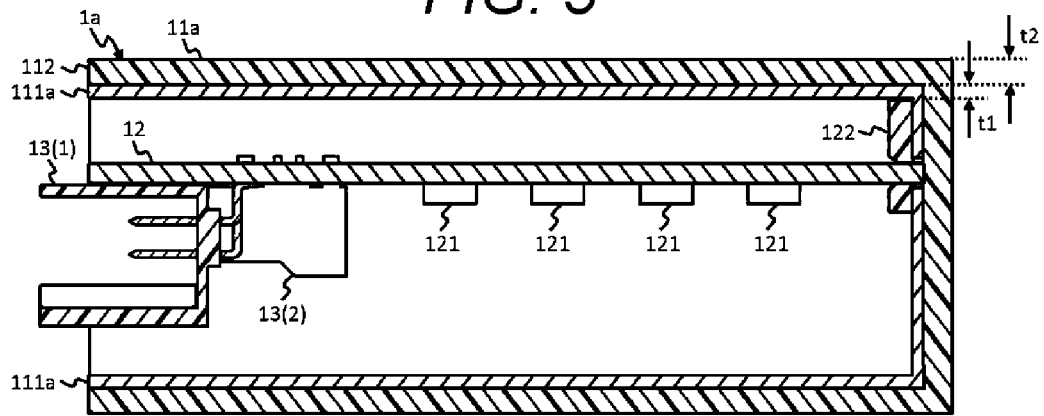
FIG. 3 is a schematic cross-sectional view of an electronic control device according to a second example.

Since the present example corresponds to a modification of the first example, differences from the first example will be mainly described. FIG. 3 is a schematic cross-sectional view of an electronic control device 1a. The electronic control device 1a in the present example includes, for example, a base portion 11a, an electronic control board 12, a connector 13, and an attachment portion 14.

The base portion 11a is formed in a bottomed cylindrical shape and protects the electronic control board 12. The base portion 11a is formed of, for example, two layers of a shield layer 111a and a reinforcing layer 112.

The shield layer 111a is formed of a conductive member, and suppresses electromagnetic noise generated from the electronic component 121 and suppresses the electromagnetic noise from the outside. The shield layer 111a is formed in a bottomed cylindrical shape, for example, and is provided inside the reinforcing layer 112.

A thickness of the shield layer 111a is formed to be smaller than a thickness of the reinforcing layer 112. For example, a thickness t1 of the upper surface of the shield layer 111a is smaller than a thickness t2 of the upper surface of the reinforcing layer 112.

The thickness of the shield layer 111a is set, for example, such that the shielding performance of the electromagnetic wave is a predetermined value or more. By adopting a material having a higher absorption loss of the electromagnetic wave than other materials, the thickness of the shield layer 111a may be further reduced.

Third Example

Figure 4:
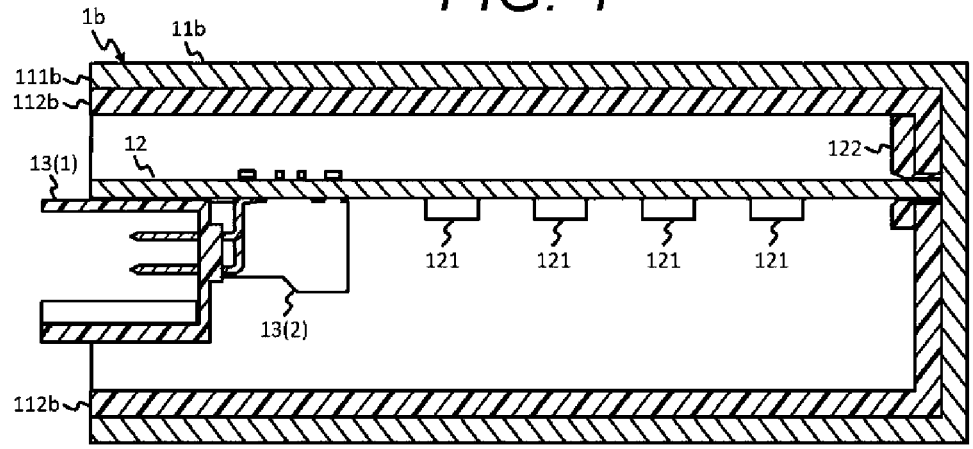
FIG. 4 is a schematic cross-sectional view of an electronic control device according to a third example.

Since the present example corresponds to a modification of the first example, differences from the first example will be mainly described. FIG. 4 is a schematic cross-sectional view of an electronic control device 1b. The electronic control device 1b in the present example includes, for example, a base portion lib, an electronic control board 12, a connector 13, and an attachment portion 14.

The base portion 11b is formed in a bottomed cylindrical shape and protects the electronic control board 12. The base portion 11b is formed of, for example, two layers of a shield layer 111b and a reinforcing layer 112b.

The shield layer 111b is formed of a conductive member, and suppresses electromagnetic noise generated from the electronic component 121 and suppresses the electromagnetic noise from the outside. The shield layer 111b is formed in a bottomed cylindrical shape, for example, and is provided outside the reinforcing layer 112b. The shield layer 111b is formed so as to cover, for example, a side surface, an upper surface, a lower surface, and a back surface of the reinforcing layer 112b.

The reinforcing layer 112b is formed of a member different from that of the shield layer 111b, and reinforces the mechanical strength of the electronic control device 1b. The reinforcing layer 112b is formed in a bottomed cylindrical shape, for example, and is provided inside the shield layer 111b.

Fourth Example

Figure 5:
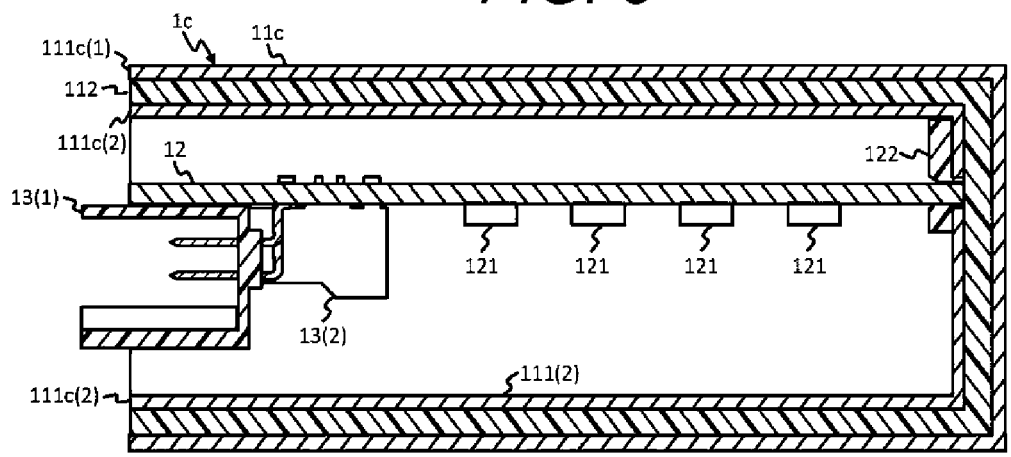
FIG. 5 is a schematic cross-sectional view of an electronic control device according to a fourth example.

Since the present example corresponds to a modification of the first example, differences from the first example will be mainly described. FIG. 5 is a schematic cross-sectional view of an electronic control device 1c. The electronic control device 1c in the present example includes, for example, a base portion 11c, an electronic control board 12, a connector 13, and an attachment portion 14.

The base portion 11c is formed in a bottomed cylindrical shape and protects the electronic control board 12. The base portion 11c is formed of, for example, three layers of two shield layers 111c(1) and 111c(2) and one reinforcing layer 112. Note that the shield layers 111c(1) and 111c(2) may be referred to as a shield layer 111c unless otherwise distinguished.

The shield layer 111c is formed of a conductive member, and suppresses electromagnetic noise generated from the electronic component 121 and suppresses the electromagnetic noise from the outside. The shield layer 111c(1) is formed in a bottomed cylindrical shape, for example, and is provided outside the reinforcing layer 112. The shield layer 111c(2) is formed in a bottomed cylindrical shape, for example, and is provided outside the reinforcing layer 112. The reinforcing layer 112 is clamped between the shield layers 111c(1) and 111c(2).

In the electronic control device 1c described above, since the base portion 11c is formed such that the reinforcing layer 112 is clamped between the shield layers 111c, electromagnetic waves can be reflected between the shield layers 111c. As a result, the electronic control device 1c can multiply reflect the electromagnetic wave, so that the electromagnetic shielding performance of the electromagnetic noise can be improved.

Fifth Example

Figure 6:
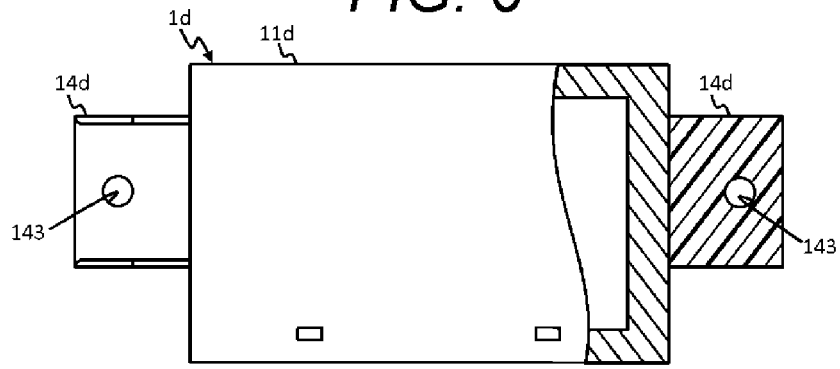
FIG. 6 is a partially cutaway schematic top view of an electronic control device according to a fifth example.

Since the present example corresponds to a modification of the first example, differences from the first example will be mainly described. FIG. 6 is a partially cutaway schematic top view of an electronic control device 1d. The electronic control device 1d in the present example includes, for example, a base portion 11d, an electronic control board 12, a connector 13, and an attachment portion 14d.

The base portion 11d is formed in a bottomed cylindrical shape and protects the electronic control board 12. The base portion 11d is formed of, for example, a conductive member. The base portion 11d is not limited to the conductive member, and may be formed by stacking a resin member and a conductive member.

The attachment portion 14d is attached to the vehicle by, for example, a screw. The attachment portion 14d is formed so as to protrude outward from the side surface of the base portion 11d, for example. A screw hole 143 penetrating in the vertical direction is formed in the attachment portion 14. The attachment portion 14d is formed of, for example, a resin.

Sixth Example

Figure 7:
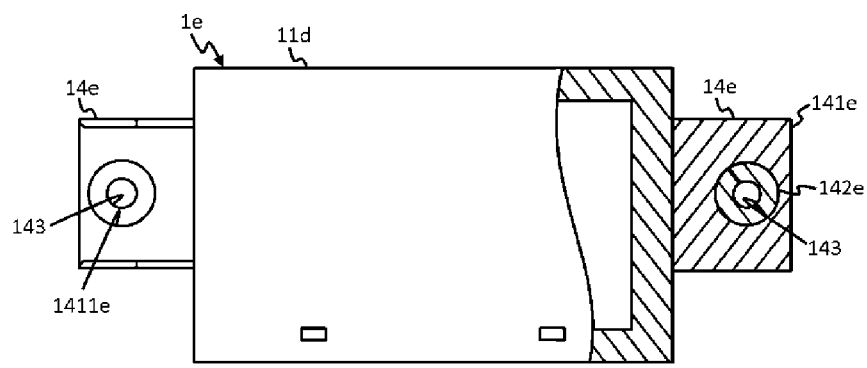
FIG. 7 is a partially cutaway schematic top view of an electronic control device according to a sixth example.

Since the present example corresponds to a modification of the first example, differences from the fifth example will be mainly described. FIG. 7 is a partially cutaway schematic top view of an electronic control device 1e. The electronic control device 1e in the present example includes, for example, a base portion 11d, an electronic control board 12, a connector 13, and an attachment portion 14e.

The attachment portion 14e is attached to the vehicle by, for example, a screw. The attachment portion 14e includes, for example, an attachment side shield portion 141e as a "first attachment portion" and an attachment side reinforcement portion 142e as a "second attachment portion".

The attachment side shield portion 141e is formed of a conductive member and suppresses electromagnetic noise. The attachment side shield portion 141e is formed so as to protrude outward from a side surface of the base portion 11d. For example, a through hole 1411e penetrating from the upward direction to the downward direction is formed in the attachment side shield portion 141e. The shape of the through hole 1411e is, for example, a circular shape.

The attachment side reinforcement portion 142e is formed of a member different from that of the attachment side shield portion 141e, and reinforces the attachment portion 14e. The attachment side reinforcement portion 142e is formed of, for example, an insulating resin that is mechanically stronger than the attachment side shield portion 141e. The attachment side reinforcement portion 142e is formed in, for example, a cylindrical shape and has a screw hole 143.

The attachment side reinforcement portion 142e is mechanically connected to the through hole 1411e. The thickness of the attachment side reinforcement portion 142e is set to be longer than, for example, a bearing surface of a head of a screw to be used.

Since the electronic control device 1e described above includes the attachment side reinforcement portion 142e, the bearing surface of the screw abuts on the attachment side reinforcement portion 142e when the attachment portion 14e is screwed. Thus, the attachment side reinforcement portion 142e can suppress distortion due to screwing.

Seventh Example

Figure 8:
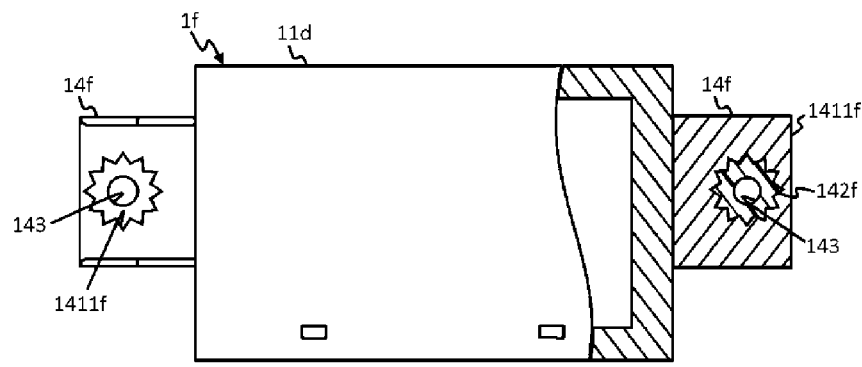
FIG. 8 is a partially cutaway schematic top view of an electronic control device according to a seventh example.

Since the present example corresponds to a modification of the sixth example, differences from the sixth example will be mainly described. FIG. 8 is a partially cutaway schematic top view of an electronic control device 1f. The electronic control device if in the present example includes, for example, a base portion 11d, an electronic control board 12, a connector 13, and an attachment portion 14f.

The attachment portion 14f is attached to the vehicle by, for example, a screw. The attachment portion 14f includes, for example, an attachment side shield portion 141f and an attachment side reinforcement portion 142f.

The attachment side shield portion 141f is formed of a conductive member and suppresses electromagnetic noise. The attachment side shield portion 141f is formed so as to protrude outward from a side surface of the base portion 11d. For example, a through hole 1411f penetrating from the upward direction to the downward direction is formed in the attachment side shield portion 141f. The through hole 1411f is formed in, for example, a polygonal shape, and the uneven shape functions as a stopper for engaging the attachment side shield portion 141f and the attachment side reinforcement portion 142f. As a result, the uneven shape of the contact surface between the attachment side shield portion 141f and the attachment side reinforcement portion 142f resists the stress when the screw is attached.

The attachment side reinforcement portion 142f is formed of a member different from that of the attachment side shield portion 141f, and reinforces the attachment portion 14f. The attachment side reinforcement portion 142f is formed of, for example, an insulating resin that is mechanically stronger than the attachment side shield portion 141f. The attachment side reinforcement portion 142f is formed in, for example, a tubular shape in which the screw hole 143 is formed, and is provided in the through hole 1411. That is, an outer peripheral surface of the attachment side reinforcement portion 142f corresponds to the shape of the through hole 1411f.

In the electronic control device 1f described above, since the connection surface between the attachment side shield portion 141f and the attachment side reinforcement portion 142f is formed in an uneven shape, the contact area can be increased as compared with the circular shape. Thus, the attachment side reinforcement portion 142f can be mechanically firmly connected to the attachment side shield portion 141f. The electronic control device 1f can prevent the attachment side reinforcement portion 141f from separating from the attachment side shield portion 142f due to stress when the attachment portion 14f is screwed.

Eighth Example

Figure 9:
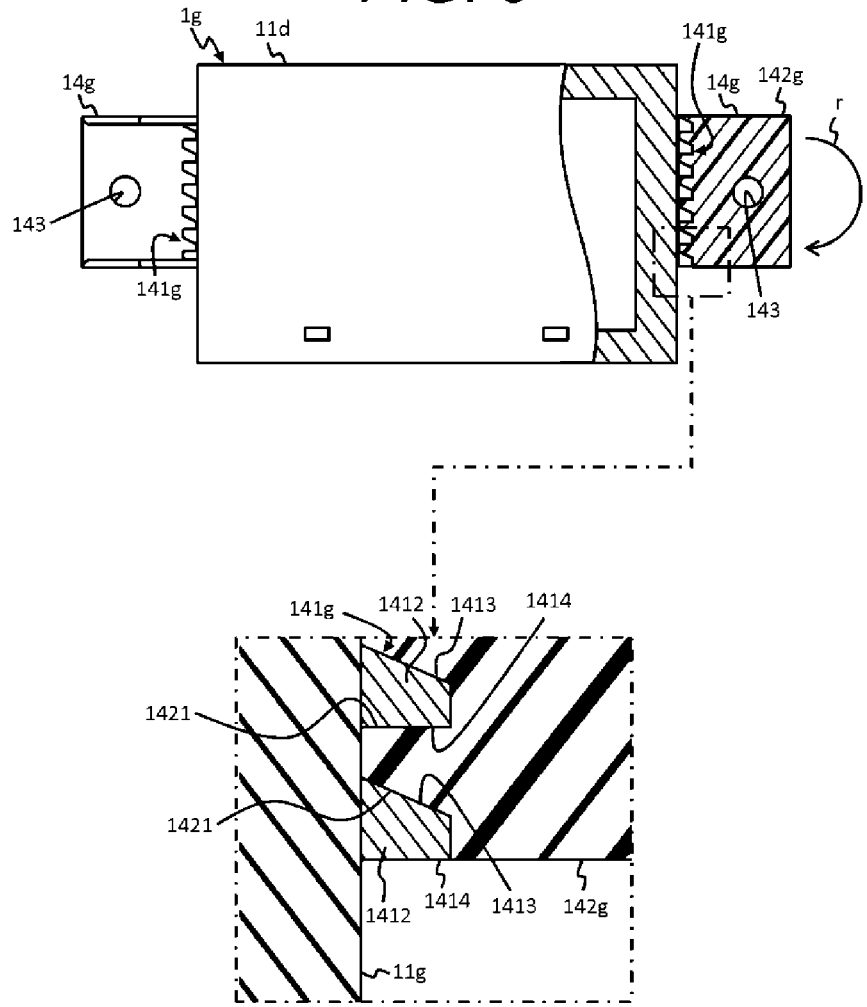
FIG. 9 is an explanatory diagram of a main part of an electronic control device according to an eighth example.

Since the present example corresponds to a modification of the fifth example, differences from the fifth example will be mainly described. FIG. 9 is an explanatory diagram of a main part of an electronic control device 1g. The electronic control device 1g in the present example includes, for example, a base portion 11d, an electronic control board 12, a connector 13, and an attachment portion 14g.

The attachment portion 14g is attached to the vehicle by, for example, a screw. The attachment portion 14g includes, for example, an attachment side shield portion 141g and an attachment side reinforcement portion 142g.

The attachment side shield portion 141g is formed of a conductive member and suppresses electromagnetic noise. The attachment side shield portion 141g includes a plurality of protrusions 1412 protruding outward from the side surface of the base portion 11d.

The protrusion 1412 is formed so as to oppose a rotation direction r of a tightening torque. The protrusion 1412 is formed, for example, in a direction along a trapezoidal shape in which an inclined surface 1413 is located in the far-side rotation direction r with respect to a predetermined surface 1414. For example, in the enlarged view of the projection view, the inclined surface 1413 is applied to the attachment portion 14g such that the rotation direction r of the torque is directed in the near-side depth direction from the outside to the inside. As a result, the inclined surface 1413 of the protrusion 1412 is formed so as to be directed in the depth direction from the outside toward the inside.

The predetermined surface 1414 facing the inclined surface 1413 of the protrusion 1412 is formed, for example, in a protruding direction. For example, the protrusion 1412 is not limited to being formed in a trapezoidal shape including the inclined surface 1413 and the predetermined surface 1414, and may have another shape such as a triangular shape.

The attachment side reinforcement portion 142g is formed of a member different from that of the attachment side shield portion 141g, and reinforces the attachment portion 14g. The attachment side reinforcement portion 142g is formed of, for example, an insulating resin that is mechanically stronger than the attachment side shield portion 141g. The attachment side reinforcement portion 142g has, for example, a screw hole 143. On the proximal end side of the attachment side reinforcement portion 142g, a plurality of recesses 1421 corresponding to the respective protrusions 1412 are formed.

The attachment side shield portion 141g and the recess 1421 of the attachment side reinforcement portion 142g are mechanically connected to each other. The contact surface between the attachment side shield portion 141g and the attachment side reinforcement portion 142g is formed in an uneven shape. As a result, the uneven shape of the contact surface between the attachment side shield portion 141g and the attachment side reinforcement portion 142g functions as a stopper for engaging the attachment side shield portion 141g and the attachment side reinforcement portion 142g.

In the electronic control device 1g described above, since the attachment side shield portion 141g is formed in a plurality of protrusion shapes, the screw tightening torque can be dispersed. Thus, the attachment side shield portion 141g can be brought into close contact engagement with the attachment side reinforcement portion 142g. The electronic control device 1g can prevent the attachment side reinforcement portion 141g from separating from the attachment side shield portion 142g when screwing is performed.

Since the inclined surface 1413 is formed along the rotation direction r of the tightening torque, the effect of the attachment side shield portion 141g can be generated in the direction opposite to the tightening torque. The attachment side shield portion 141g can be prevented from being distorted to the depth side or the front side by the tightening torque by providing the inclined surface 1413.

Ninth Example

Figure 10:
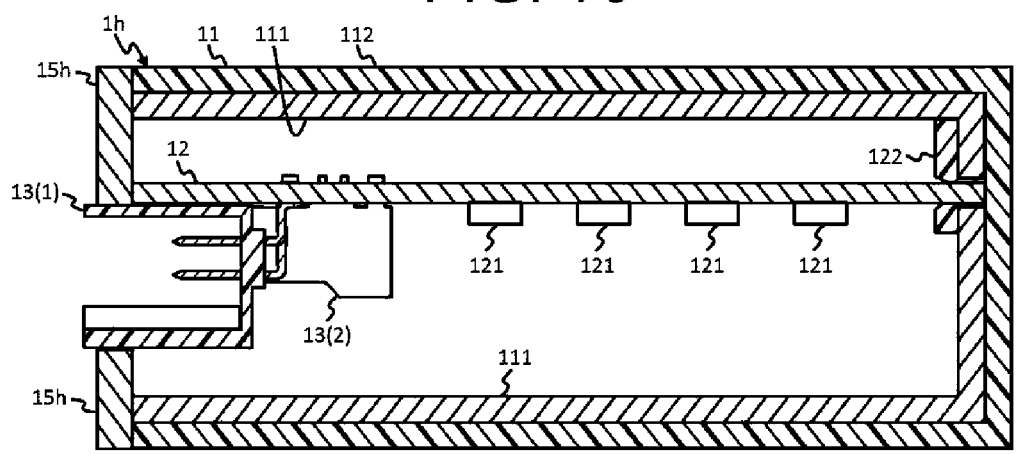
FIG. 10 is a schematic cross-sectional view of an electronic control device according to a ninth example.

Since the present example corresponds to a modification of the first example, differences from the first example will be mainly described. FIG. 10 is an explanatory diagram of a main part of an electronic control device 1h. The electronic control device 1h in the present example includes, for example, a base portion 11, an electronic control board 12, a connector 13, an attachment portion 14, and a cover portion 15h.

The cover portion 15h covers the opening of the base portion 11 and protects the electronic control board 12. The cover portion 15h is formed of a conductive member that suppresses electromagnetic noise from the outside. The cover portion 15h may be formed of, for example, metal such as aluminum. The cover portion 15h is mechanically connected to the base portion 11, for example. A hole for exposing the connector 13 to the outside is formed in the cover portion 15h.

The front end of the base portion 11 abuts on the cover portion 15h. The cover portion 15h has waterproofness and dust-proofness by abutting on the base portion 11.

The electronic control device 1h described above can block electromagnetic noise from the front side by including the conductive cover portion 15h. As a result, the electronic control device 1h can improve the electromagnetic shielding performance.

Tenth Example

Figure 11:
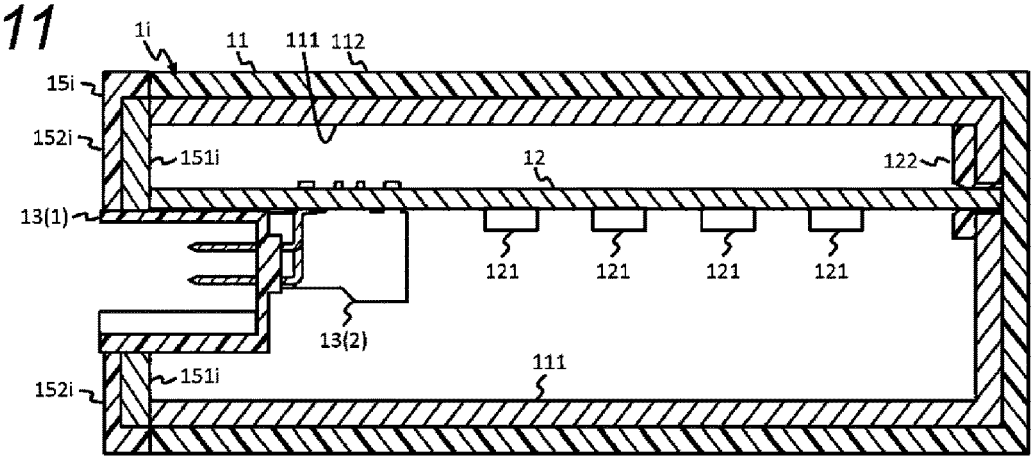
FIG. 11 is a schematic cross-sectional view of an electronic control device according to a tenth example.

Since the present example corresponds to a modification of the first example, differences from the first example will be mainly described. FIG. 11 is a schematic cross-sectional view of an electronic control device 1*i*. The electronic control device 1*i* in the present example includes, for example, a base portion 11, an electronic control board 12, a connector 13, an attachment portion 14, and a cover portion 15*i*.

The cover portion 15*i* covers the opening of the base portion 11 and protects the electronic control board 12. The cover portion 15*i* is mechanically connected to the base portion 11, for example. A hole for exposing the connector 13 to the outside is formed in the cover portion 15*i*. The cover portion 15*i* includes, for example, a cover side shield portion 151*i* as a "first cover portion" and a cover side reinforcement portion 152*i* as a "second cover portion".

The cover side shield portion 151*i* is formed of a conductive member and suppresses electromagnetic noise. The cover side shield portion 151*i* is formed of, for example, metal such as aluminum. The cover side shield portion 151*i* is provided inside the cover side reinforcement portion 152*i*, for example, and abuts on an end on the front side of the shield layer 111.

The cover side reinforcement portion 152*i* is formed of a member different from that of the cover side shield portion 151*i*, and reinforces the cover portion 15*i*. The cover side reinforcement portion 152*i* is formed of, for example, a resin that is mechanically stronger than that of the cover side shield portion 151*i*. The cover side reinforcement portion 152*i* is provided outside the cover side shield portion 151*i* and abuts on an end on the front side of the reinforcing layer 112.

Since the electronic control device 1*i* described above includes the cover side shield portion 151*i* and the cover side reinforcement portion 152*i* in the cover portion 15*i*, electromagnetic compatibility and mechanical strength can be secured. As a result, the electronic control device 1*i* can be reduced in weight and manufacturing cost.

Eleventh Example

Figure 12:
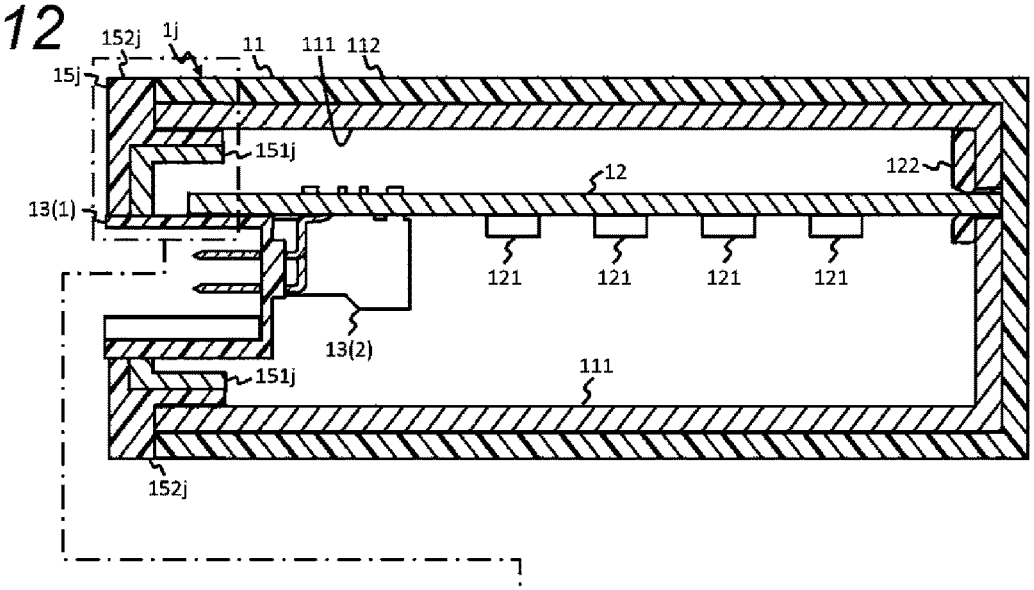
FIG. 12 is an explanatory diagram of a main part of an electronic control device according to an eleventh example.
Figure 12:
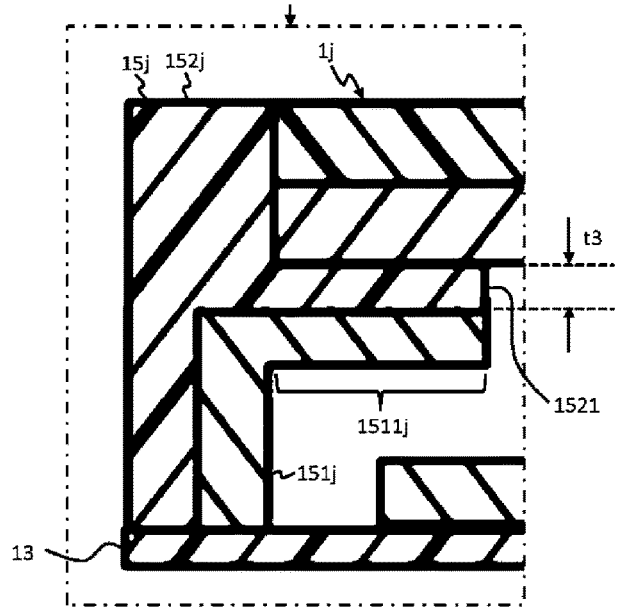

Since the present example corresponds to a modification of the tenth example, differences from the tenth example will be mainly described. FIG. 12 is a schematic cross-sectional view of an electronic control device 1*j*. The electronic control device 1*j* in the present example includes, for example, a base portion 11, an electronic control board 12, a connector 13, an attachment portion 14, and a cover portion 15*j*.

The cover portion 15*j* covers the opening of the base portion 11 and protects the electronic control board 12. The cover portion 15*j* is mechanically connected to the base portion 11, for example. A hole for exposing the connector 13 to the outside is formed in the cover portion 15*j*. The cover portion 15*j* includes, for example, a cover side shield portion 151*j* and a cover side reinforcement portion 152*j*.

The cover side shield portion 151*j* is formed of a conductive member and suppresses electromagnetic noise. The cover side shield portion 151*j* is formed of, for example, metal such as aluminum. The cover side shield portion 151*j* is provided inside the cover side reinforcement portion 152*j*, for example. The cover side shield portion 151*j* includes a wrap portion 1511*j* as a "third cover portion" formed toward the depth direction.

The cover side reinforcement portion 152*j* is formed of a member different from that of the cover side shield portion 151*j*, and reinforces the cover portion 15*j*. The cover side reinforcement portion 152*j* is formed of, for example, a resin that is mechanically stronger than that of the cover side shield portion 151*j*. The cover side reinforcement portion 152*j* is provided outside the cover side shield portion 151*i*, and abuts on an end on the front side of the reinforcing layer 112 and an end on the front side of the shield layer 111. The cover side reinforcement portion 152*j* includes, for example, a support portion 1521 extending in the depth direction.

For example, the support portion 1521 prevents the cover portion 15*j* from being displaced from the opening of the base portion 11. The support portion 1521 is clamped between the wrap portion 1511*j* and the shield layer 111. As a result, the wrap portion 1511*j* and the shield layer 111 are separated from each other. The length between the wrap portion 1511*j* and the shield layer 111 is, for example, a thickness t3 of the support portion 1521.

Since the electronic control device 1*j* described above includes the wrap portion 1511*j*, the cover side shield portion 151*i* and the shield layer 111 can be doubled. As a result, the electromagnetic wave can be reflected between the shield layer 111 and the wrap portion 1511*j*. As a result, the electronic control device 1*i* can multiply reflect the electromagnetic wave, so that the shielding rate of the electromagnetic noise can be improved.

Twelfth Example

Figure 13:
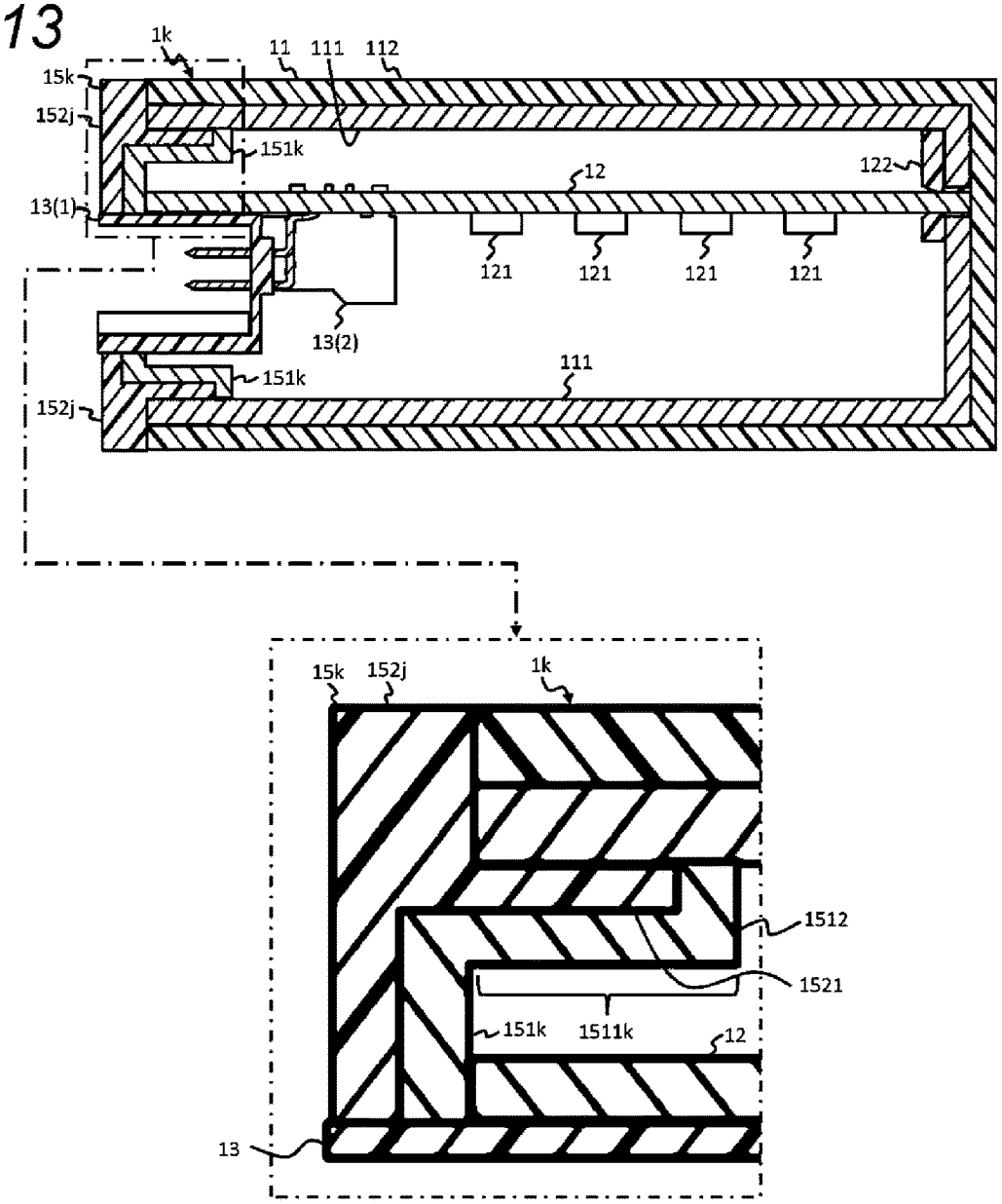
FIG. 13 is an explanatory diagram of a main part of an electronic control device according to a twelfth example.

Since the present example corresponds to a modification of the eleventh example, differences from the eleventh example will be mainly described. FIG. 13 is a schematic cross-sectional view of an electronic control device 1*k*. The electronic control device 1*k* in the present example includes, for example, a base portion 11, an electronic control board 12, a connector 13, an attachment portion 14, and a cover portion 15*k*.

The cover portion 15*k* covers the opening of the base portion 11 and protects the electronic control board 12. The cover portion 15*k* is mechanically connected to the base portion 11, for example. A hole for exposing the connector 13 to the outside is formed in the cover portion 15*k*. The cover portion 15*k* includes a cover side shield portion 151*k* and a cover side reinforcement portion 152*j*.

The cover side shield portion 151*k* is formed of a conductive member and suppresses electromagnetic noise. The cover side shield portion 151*k* is formed of, for example, metal such as aluminum. The cover side shield portion 151*k* is provided inside the cover side reinforcement portion 152*j*, for example. The cover side shield portion 151*k* includes a wrap portion 1511*k* formed toward the depth direction.

The wrap portion 1511*k* abuts on the shield layer 111. The wrap portion 1511*k* includes, for example, an abutment portion 1512 that abuts on the shield layer 111. For example, the abutment portion 1512 is formed to extend from the tip of the wrap portion 1511*k* in the depth direction toward the shield layer 111. Note that the abutment portion 1512 is not limited to be provided, and the support portion 1521 of the cover side reinforcement portion 152*j* may not be formed, and the shield layer 111 may be abutted from the proximal end side of the wrap portion 1511*k*.

Since the electronic control device 1*k* described above includes the abutment portion 1512, the cover side shield portion 151*k* and the shield layer 111 can be brought into contact with each other. As a result, the electronic control device 1*j* can eliminate a gap between the shield layer 111 and the cover side shield portion 151*k*, so that the electromagnetic shielding performance can be improved.

Thirteenth Example

Figure 14:
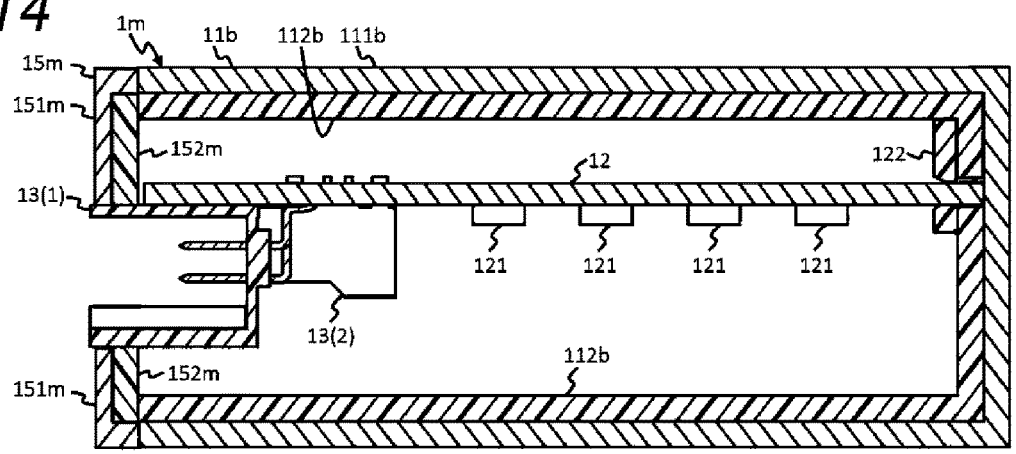
FIG. 14 is a schematic cross-sectional view of an electronic control device according to a thirteenth example.

Since the present example corresponds to a modification of the third example, differences from the third example will be mainly described. FIG. 14 is a schematic cross-sectional view of an electronic control device 1m. The electronic control device 1m in the present example includes, for example, a base portion 11b, an electronic control board 12, a connector 13, an attachment portion 14, and a cover portion 15m.

The cover portion 15m covers the opening of the base portion 11b and protects the electronic control board 12. The cover portion 15m is mechanically connected to the base portion 11b, for example. A hole for exposing the connector 13 to the outside is formed in the cover portion 15m. The cover portion 15m includes a cover side shield portion 151m and a cover side reinforcement portion 152m.

The cover side shield portion 151m is formed of a conductive member and suppresses electromagnetic noise. The cover side shield portion 151m is formed of, for example, metal such as aluminum. The cover side shield portion 151m is provided outside the cover side reinforcement portion 152m, for example, and abuts on an end on the front side of the shield layer 111b.

The cover side reinforcement portion 152m is formed of a member different from that of the cover side shield portion 151m, and reinforces the cover portion 15m. The cover side reinforcement portion 152m is formed of, for example, a resin that is mechanically stronger than that of the cover side shield portion 151m. The cover side reinforcement portion 152m is provided inside the cover side shield portion 151m and abuts on an end of the reinforcing layer 112b on the front side.

Fourteenth Example

Figure 15:
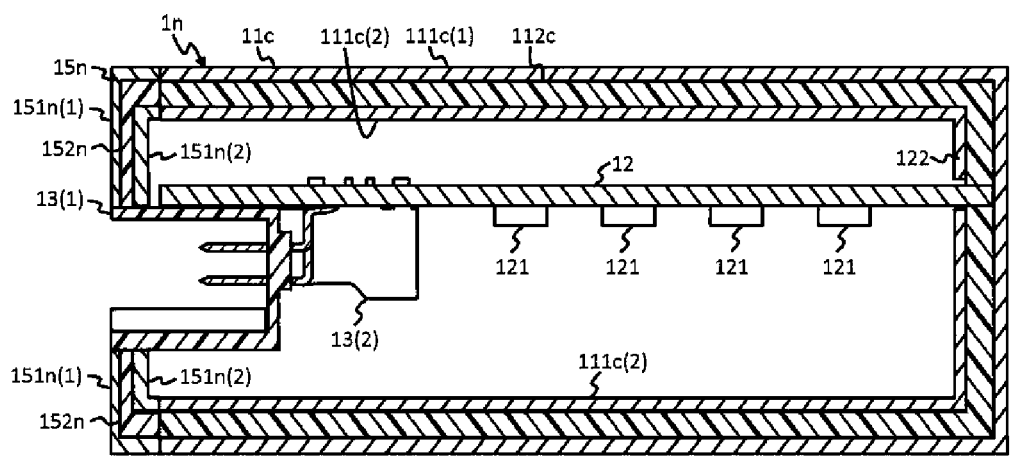
FIG. 15 is a schematic cross-sectional view of an electronic control device according to a fourteenth example.

Since the present example corresponds to a modification of the fourth example, differences from the fourth example will be mainly described. FIG. 15 is a schematic cross-sectional view of an electronic control device 1n. The electronic control device 1n in the present example includes, for example, a base portion 11c, an electronic control board 12, a connector 13, an attachment portion 14, and a cover portion 15n.

The cover portion 15n covers the opening of the base portion 11 and protects the electronic control board 12. The cover portion 15m is mechanically connected to the base portion 11c, for example. A hole for exposing the connector 13 to the outside is formed in the cover portion 15n.

The cover portion 15n includes cover side shield portions 151n(1) and 151n(2) and a cover side reinforcement portion 152n. Note that the cover side shield portions 151n(1) and 151n(2) may be referred to as cover side shield portions 151n unless otherwise distinguished.

The cover side shield portion 151n is formed of a conductive member and suppresses electromagnetic noise. The cover side shield portion 151n is formed of, for example, metal such as aluminum. The cover side shield portion 151n(1) is provided outside the cover side reinforcement portion 152n, for example, and abuts on an end on the front side of the shield layer 111c(1). The cover side shield portion 151n(2) is provided inside the cover side reinforcement portion 152n, for example, and abuts on an end on the front side of the shield layer 111c(2).

The cover side reinforcement portion 152n is formed of a member different from that of the cover side shield portion 151n, and reinforces the cover portion 15n. The cover side reinforcement portion 152n is formed of, for example, a resin that is mechanically stronger than that of the cover side shield portion 151n. The cover side reinforcement portion 152n is clamped between the cover side shield portions 151n and abuts on the end of the reinforcing layer 112c on the front side.

The electronic control device 1n described above can reflect the electromagnetic wave between the cover side shield portions 152n by clamping the cover side reinforcement portion 151n between the cover side shield portions 151n. Since the electronic control device 1n can multiply reflect electromagnetic waves, the shielding rate of electromagnetic noise can be improved.

Although the embodiments of the present invention have been described in detail above, the present invention is not limited to the above embodiments, and various design changes can be made without departing from the spirit of the present invention described in the claims. For embodiment, the above-described embodiments are described in detail in order to describe the present invention in an easy-to-understand manner, and are not necessarily limited to those having all the described configurations. Further, a part of the configuration of one embodiment can be replaced with the configuration of another embodiment, and the configuration of another embodiment can be added to the configuration of one embodiment. Furthermore, it is possible to add, delete, and replace other configurations for a part of the configuration of each embodiment. In the drawings, control lines and information lines that are considered to be necessary for description are illustrated, and not all control lines and information lines on a product are necessarily illustrated.

REFERENCE SIGNS LIST

1 Electronic control device
11 Base portion
111 Shield layer
112 Reinforcing layer
12 Electronic control board
121 Electronic component
122 Fixing portion
13(1), 13(2) Connector
14 Attachment portion
143 Screw hole

The invention claimed is:

1. An electronic control device comprising:
a base portion formed in a square tubular shape;
an electronic control board provided in the base portion;
a connector provided on an opening side of the base portion and electrically connected to the electronic control board; and
an attachment portion comprising an insulating member made of an insulating material and formed to protrude outward from an outer side surface of the base portion and attached to an other device, wherein the attachment portion comprises a plurality of conductive protrusions formed of a conductive material that extends into the insulating material, the insulating member having two side walls and a through hole for attaching to the other device, wherein the plurality of conductive protrusions are provided within a width of the insulating member,
wherein the base portion includes at least one first layer formed of a conductive member, and
at least one second layer formed of a member different from that of the first layer.

2. The electronic control device according to claim 1, wherein the second layer is formed of a resin member that is mechanically stronger than the conductive member.

3. The electronic control device according to claim 1, wherein the second layer is clamped between two or more of the at least one first layer.

4. The electronic control device according to claim 1, wherein
the plurality of conductive protrusion protrude outward from the side surface,
each of the plurality of conductive protrusions includes an inclined surface, and
the inclined surface is located on a far-side rotation direction of a hole within the attachment portion.

5. The electronic control device according to claim 1, wherein the plurality of conductive protrusions have a trapezoidal shape.

6. An electronic control device comprising:
a base portion formed in a square tubular shape;
an electronic control board provided in the base portion;
a connector provided on an opening side of the base portion and electrically connected to the electronic control board; and
an attachment portion comprising an insulating member made of an insulating material and formed to protrude outward from an outer side surface of the base portion and attached to an other device,
wherein the attachment portion includes
a first attachment portion comprising a plurality of conductive protrusions formed of a conductive material,
a second attachment portion formed of a member different from that of the first attachment portion and comprising an insulating member made of an insulating material and formed to protrude outward from an outer side surface of the base portion and attached to an other device,
wherein the plurality of conductive protrusions extends into the insulating material, the insulating member having two side walls and a through hole for attaching to the other device, wherein the plurality of conductive protrusions are provided within a width of the insulating member.

7. The electronic control device according to claim 6, wherein the second attachment portion is formed of a resin member that is mechanically stronger than the conductive member.

8. The electronic control device according to claim 6, wherein the second attachment portion is attached to the other device, and
a stopper with which the first attachment portion and the second attachment portion are engaged is formed.

9. The electronic control device according to claim 6, wherein
the plurality of conductive protrusion protrude outward from the side surface,
each of the plurality of conductive protrusions includes an inclined surface, and
the inclined surface is located on a far-side rotation direction of a hole within the attachment portion.

10. The electronic control device according to claim 6, wherein the plurality of conductive protrusions have a trapezoidal shape.

11. An electronic control device comprising:
a base portion formed in a square tubular shape;
a cover portion formed to cover an opening of the base portion;
an electronic control board provided in the base portion;
an attachment portion comprising an insulating member made of an insulating material and formed to protrude outward from an outer side surface of the base portion and attached to an other device, wherein the attachment portion comprises a plurality of conductive protrusions formed of a conductive material that extends into the insulating material, the insulating member having two side walls and a through hole for attaching to the other device, wherein the plurality of conductive protrusions are provided within a width of the insulating member; and
a connector provided on an opening side of the base portion and electrically connected to the electronic control board,
wherein the cover portion includes
at least one first cover portion formed of a conductive member, and
at least one second cover portion formed of a member different from that of the least one first cover portion.

12. The electronic control device according to claim 11, wherein the second cover portion is formed of a resin member that is mechanically stronger than the conductive member.

13. The electronic control device according to claim 11, wherein the base portion includes a conductive layer formed of the conductive member, and
the first cover portion includes a third cover portion formed toward a bottom portion side of the base portion.

14. The electronic control device according to claim 11, wherein the second cover portion is clamped between two or more of the least one first cover portion.

15. The electronic control device according to claim 11, wherein
the plurality of conductive protrusion protrude outward from the side surface,
each of the plurality of protrusions includes an inclined surface, and
the inclined surface is located on a far-side rotation direction of a hole within the attachment portion.

16. The electronic control device according to claim 11, wherein the plurality of conductive protrusions have a trapezoidal shape.

* * * * *